United States Patent [19]
Takeuchi et al.

[11] Patent Number: 5,455,786
[45] Date of Patent: Oct. 3, 1995

[54] FERROELECTRIC MEMORY

[75] Inventors: Kan Takeuchi, Kodaira; Katsumi Matsuno, Kokubunji; Yoshinobu Nakagome, Hamura; Masakazu Aoki, Tokorozawa, all of Japan

[73] Assignee: Hitachi, Ltd., Tokyo, Japan

[21] Appl. No.: 257,542

[22] Filed: Jun. 9, 1994

[30] Foreign Application Priority Data

Jun. 23, 1993 [JP] Japan .................................. 5-151917

[51] Int. Cl.$^6$ ................................................ G11C 11/22
[52] U.S. Cl. ............................ 365/145; 365/149; 365/203
[58] Field of Search .................................. 365/145, 149, 365/203

[56] References Cited

U.S. PATENT DOCUMENTS

| | | | |
|---|---|---|---|
| 4,809,225 | 2/1989 | Dimmler et al. | 365/145 |
| 4,873,664 | 10/1989 | Eaton, Jr. | 365/145 |
| 4,974,204 | 11/1990 | Miller | 365/145 |
| 5,010,518 | 4/1991 | Toda | 365/145 |

FOREIGN PATENT DOCUMENTS

| | | | |
|---|---|---|---|
| 0278167 | 8/1988 | European Pat. Off. | 365/145 |
| 404141883 | 5/1992 | Japan | 365/145 |
| 404366495 | 12/1992 | Japan | 365/145 |

*Primary Examiner*—David C. Nelms
*Assistant Examiner*—Son Dinh
*Attorney, Agent, or Firm*—Antonelli, Terry, Stout & Kraus

[57] ABSTRACT

A highly reliable and high speed ferroelectric memory having high degree of integration is provided. In a ferroelectric memory having a plurality of memory cells M1 each constituted by one transistor and one ferroelectric capacitor. In the normal operation, the ferroelectric memory is used as a volatile memory in which a voltage of a storage node ST1 is utilized as the stored information. Both an electric potential at a plate PL1 of the ferroelectric capacitor and a precharge electric potential on a data line DL1(j) are made Vcc/2.

9 Claims, 10 Drawing Sheets

FERROELECTRIC MEMORY

BACKGROUND OF THE INVENTION AND SUMMARY OF THE INVENTION

The present invention relates, in general, to a nonvolatile semiconductor memory employing a ferroelectric material and more particularly to a ferroelectric memory which is capable of holding the newest information as the nonvolatile information and of realizing high integration, high reliability and high speed operation.

A ferroelectric random access memory (herein-after, referred to as "an FERAM" for short, when applicable) employing a ferroelectric material is a nonvolatile memory which operates to store the information therein on the basis of the polarization state of ferroelectric materials. However, in the prior art ferroelectric memory, the polarization is switched in the operation of reading out the information as well as in the operation of writing the information, causing fatigue in a film made of a ferroelectric material. As a result, there arises a problem that the permitted number of accesses with respect to the rewrite and read of the information is remarkably limited as compared with the dynamic random access memories (the DRAMs) for example. In addition, there arises another problem that since a fixed period of time is required for the switch of the polarization, the operation time is necessarily delayed.

Figure 2:
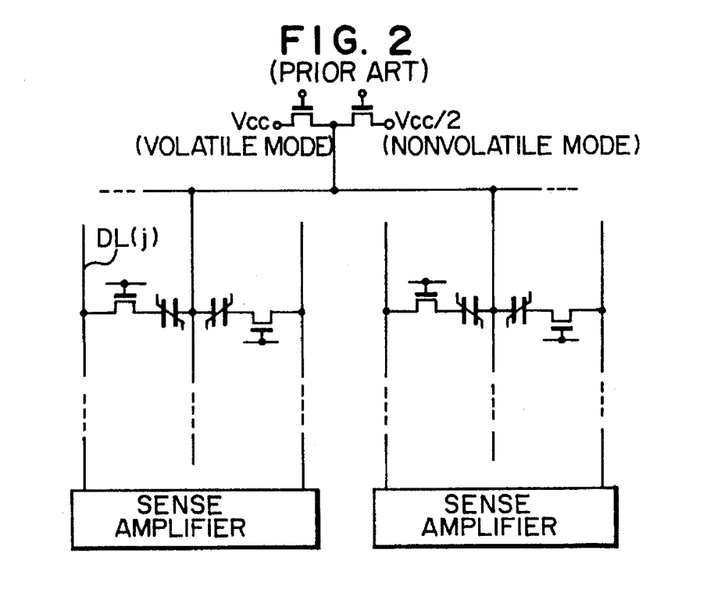
FIG. 2 is a circuit diagram showing an array configuration of the prior art ferroelectric memory.

As for the method of solving the problems of the fatigue of the ferroelectric film and the reduction of the read speed which occur along with the switch of the polarization, the following method is proposed in JP-A-3-283176. That is, as shown in an array configuration of FIG. 2, in the normal operation, the electric potential on a plate line is made Vcc for example so that the FERAM is used as the DRAM, and before the power supply has been turned off, on the basis of the write operation by the FERAM, the information of interest is stored in the form of nonvolatile information. If the electric potential on the plate line is made Vcc, in the case where the electric potential at the storage node is either 0 V or Vcc, the polarization is not inverted at all. Therefore, the problem of the fatigue of the ferroelectric capacitor can be effectively prevented and also the reduction of the read speed does not occur. Next, when turning the power supply on, if the non-volatile information is read out on the basis of the read operation by the FERAM, the FERAM can be substantially operated as the nonvolatile memory.

However, in the above-mentioned memory with both DRAM and FERAM modes, there arises still another problem that the operation of converting the volatile information into the nonvolatile information is complicated. That is, it is necessary that with respect to all the memory cells, after the information is first read out on the basis of the operation by DRAMs, in correspondence to that information thus read out, that information is stored in the form of nonvolatile information on the basis of the FERAM operation. In particular, in the case where the power source assumes the off state due to unexpected trouble, it is very difficult to speedily complete the above-mentioned conversion operation. For the period of time when in the above-mentioned system, the ferroelectric memory is used as the DRAM, all the polarization of the ferroelectric material is arranged in one direction. Therefore, all the stored information is erased along with the unexpected off state of the power supply.

The present invention was made in order to overcome the above-mentioned problems associated with the prior art ferroelectric memory and it is therefore an object of the present invention to provide a highly reliable and high speed nonvolatile memory (a ferroelectric memory) having high degree of integration which, while constituted by one transistor and one capacitor in the same way as that in the DRAM, is capable of mitigating the fatigue of a ferroelectric capacitor due to the polarization switch and of holding the newest information in the form of nonvolatile information even in the case where the power supply is forced to be turned off due to the unexpected trouble.

It is another object of the present invention to provide a highly reliable and high speed nonvolatile memory (a ferroelectric memory) with high degree of integration which has the same memory cell configuration as that of the static random access memories (the SRAMs).

In order to attain the above-mentioned objects, in a semiconductor memory having a plurality of memory cells each constituted by at least one transistor and one ferroelectric capacitor, the ferroelectric memory according to the present invention has means (constituted by a precharge circuit, a circuit for detecting a power supply voltage, a circuit for supplying a plate electric potential, and the like) for performing, as a nonvolatile memory, e.g., a DRAM, the read and write operations in a normal state and for making speedily a plate electric potential the ground electric potential (0 V) in an off state of a power supply. The plate electric potential is set to Vcc/2 and a data line precharge electric potential in the read operation is also set to Vcc/2. In addition, a configuration is possibly designed in such a way that the plate is common to only the memory cells connected to the common word line (the configuration having a plurality of plate lines) in order to further improve the reliability of the ferroelectric memory, or alternatively the above-mentioned means is included in SRAMs.

Incidentally, the present ferroelectric memory is suitable for a system in which the number of read operations is larger than the number of rewrite operations, e.g., a system which is applied to the storage of the data and the program itself in the case where the calculation is carried out forward on the basis of the program.

In the present invention, the read operation is performed by detecting the voltage of the storage node in the same way as that in volatile memories, e.g., DRAMs. As a result of the effect in which both the plate electric potential and the data line precharge electric potential are set to Vcc/2, both the voltage detection and the subsequent amplification are performed without being accompanied by the polarization switch. Therefore, the fatigue of the ferroelectric film and the reduction of the read speed can be effectively prevented. In addition, in the polarization state of the ferroelectric materials, the newest information which has been obtained by the most recent rewrite is held. In other words, the volatile information as the storage node electric potential and the nonvolatile information as the polarization state of the ferroelectric film always coincide with each other. Although the rewrite operation is accompanied by the polarization switch, the limit of the number of rewrite operation is estimated to be equal to or larger than $10^{11}$ times which is larger by far than $10^6$ times, i.e., the limit which is considered in the electrically erasable and programmable read only memory (the EEPROM) for example. Therefore, the ferroelectric memory according to the present invention can be applied to many systems without any problem. For example, the ferroelectric memory according to the present invention can be applied to the operation of storing the data and the program itself, and the like, in the case where the calculation, in which in general, the number of read operation is larger than the number of rewrite operations, is carried out forward on the basis of the program. Means is provided which operates to, in the off state of the power supply, before the electric potential at the storage node is dropped from Vcc down to 0 V, drop speedily the plate electric potential from Vcc/2 down to 0 V, whereby the polarization state is surely held, and it is possible to leave the newest nonvolatile information which has been obtained by the most recent rewrite operation. Next, when turning the power supply on, if in accordance with the read operation by the FERAM, the nonvolatile information which was stored in the form of the polarization state of the ferroelectric film is amplified through the associated data line, the nonvolatile information of interest can be converted into the volatile information as the electric potential at the storage node. That is, it is possible to realize the high reliable and high speed nonvolatile memory having the high degree of integration.

DESCRIPTION OF THE PREFERRED EMBODIMENTS

The preferred embodiments of the present invention will hereinafter be described in detail with reference to the accompanying drawings.
(First Embodiment)

Figure 1:
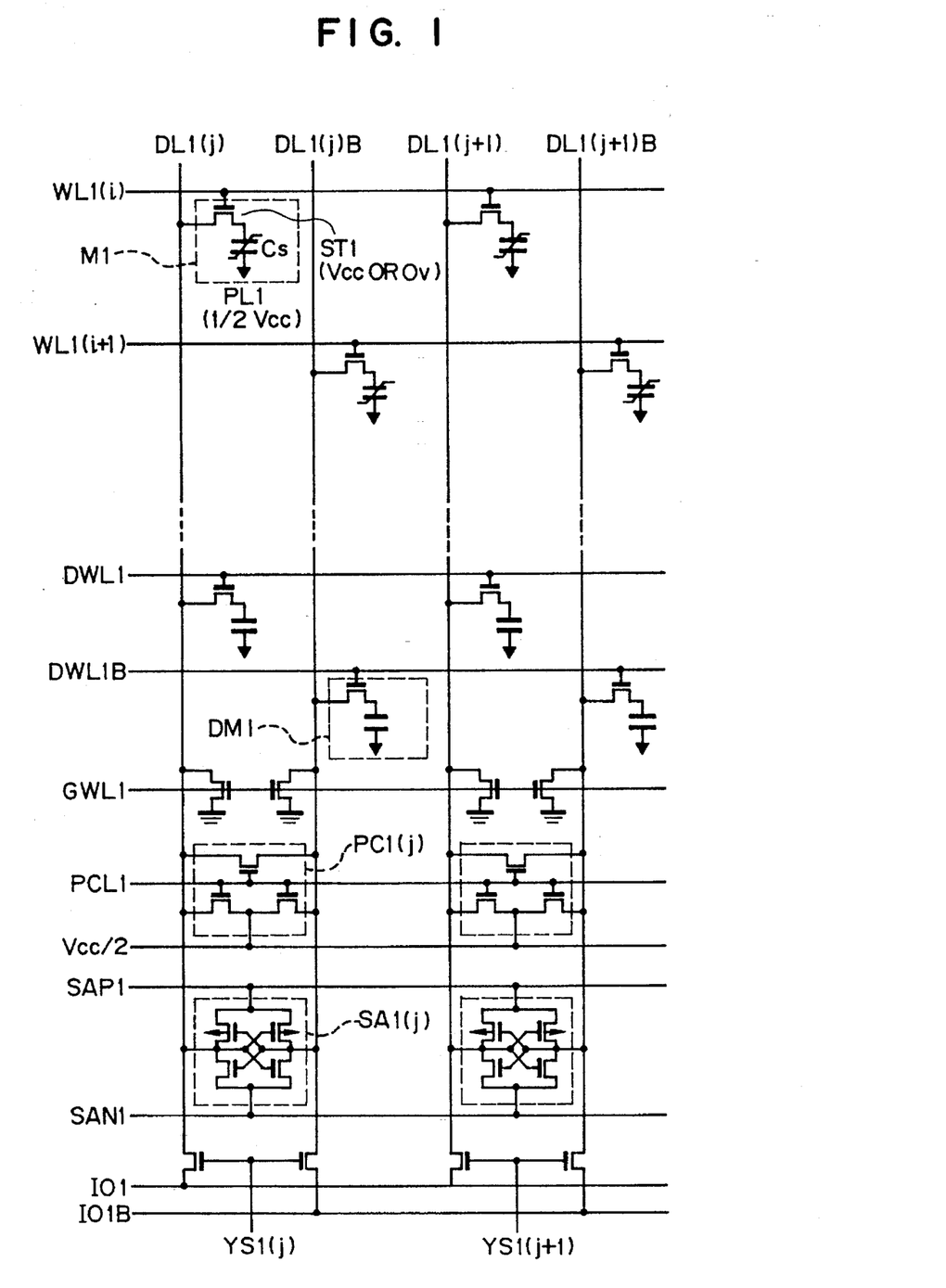
FIG. 1 is a circuit diagram showing an array configuration of a ferroelectric memory in a first embodiment of the present invention.

FIG. 1 is a circuit diagram showing an array configuration of a ferroelectric memory in a first embodiment of the present invention.

A memory cell M1 of the present embodiment is constituted by one transistor and one ferroelectric capacitor. The electric potential at a plate PL1 of the ferroelectric capacitor is always fixedly set to Vcc/2. On the other hand, in a storage node ST1 of the ferroelectric capacitor, the volatile information Vcc or 0 V is held. The electric potentials on a pair of data lines DL1(j) and DL1(j)B are continued to be held at Vcc/2 until the time just before the read or rewrite operation is performed. A sense amplifier SA1(j) which operates to detect and amplify the stored information is connected to the pair of data lines. The present memory cell array has a plurality of dummy cells DM1 each of which, when the power source is turned on, operates to read out the polarization state of a film made of a ferroelectric material and to convert the nonvolatile information into the volatile information. In addition, a signal line GWL1 and each transistor connected to the signal line GWL1 are used to precharge the associated pair of data lines to 0 V when performing the operation of reading out the nonvolatile information.

Figure 3:
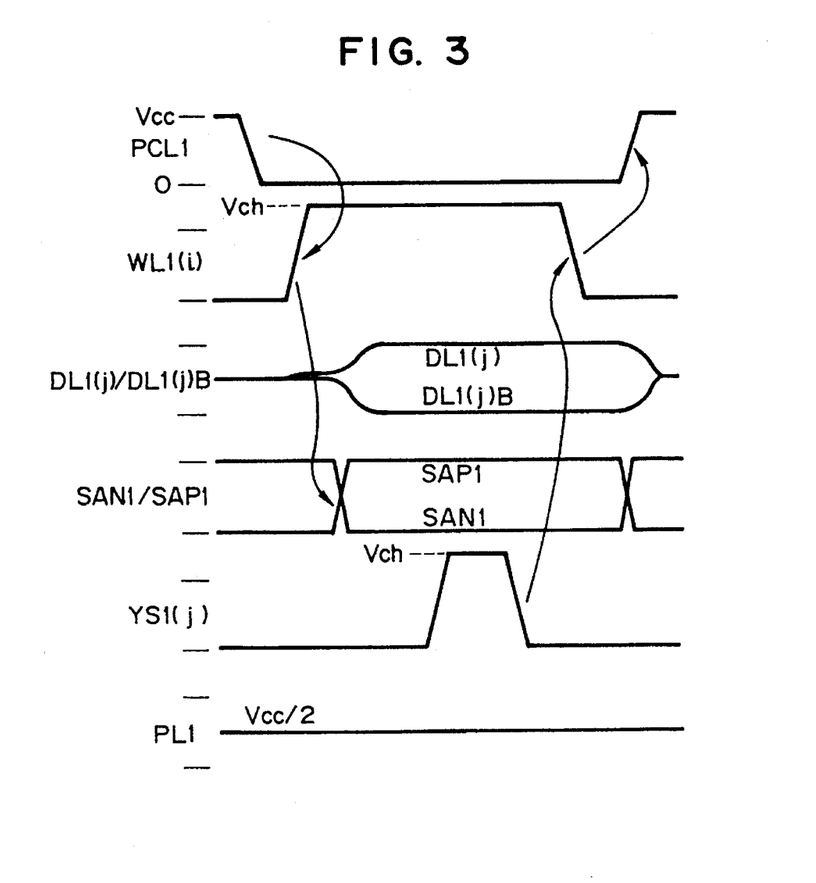
FIG. 3 is a timing chart showing the operation of reading out the stored information in the memory cell array shown in FIG. 1.

FIG. 3 is a timing chart showing the operation of reading out the stored information in the memory cell array shown in FIG. 1.

In the present embodiment, in order to detect the stored voltage of the storage node ST1, firstly, the electric potential on a precharge control line PCL1 is decreased from Vcc down to 0 V. As a result, the associated data line assume the floating state in which the electric potential thereon is Vcc/2. Next, the electric potential on a word line WLi(i) is increased from 0 V up to Vch. In this connection, the electric potential Vch is higher than the electric potential Vcc by at least the threshold voltage of the transistor. As a result, in the case where the electric potential at the storage node was Vcc, the electric potential on the data line DL1(j) becomes slightly higher than that on the data line DL1(j)B, i.e., Vcc/2. On the other hand, in the case where the electric potential at the storage node was 0 V, the electric potential on the data line DL1(j) becomes slightly lower than that on the data line DL1(j)B. The electric potential difference therebetween is detected and amplified by the sense amplifier SA1(j), whereby the electric potential on the data line DL1(j) coincides with the electric potential at the storage node, i.e., becomes Vcc or 0 V. In addition, the data line DL1(j)B becomes opposite in the electric potential to the data line DL1(j). Incidentally, in order to operate the sense amplifier, the electric potential on a control line SAP1 for the p-channel MOS transistors of the sense amplifier, and the electric potential on a control line SAN1 for the n-channel MOS transistors of the sense amplifier may be set to Vcc and 0 V, respectively. On the basis of the above-mentioned operations, the information of all the memory cells which are connected to the selected word line WL1(i) is respectively read out to the associated data lines to which the memory cells are respectively connected. In order to selectively read out the information stored in one memory cell to the outside through a pair of IO lines, the electric potential on a line YS1(j) for selecting the sense amplifier may be increased from 0 V up to Vch, and also the desired pair of data lines may be connected to the pair of IO lines. In order to complete the read operation, if the electric potential on the selection line YS1(j) is returned from Vch down to 0 V and then the electric potential on the word line WL1(i) is returned to 0 V, the storage node ST1 is electrically separated from the associated data line with the information rewritten thereto. If the electric potential on the precharge control line PCL1 is returned to Vcc and also the electric potential on the control lines SAP1 and SAN1 are returned to 0 V and Vcc, respectively, the state before the read operation is provided, and thus the operation is completed.

As described above, according to the present embodiment, the polarization state, which was stored in the ferroelectric film in correspondence to the electric potential at the storage node before the read operation, is not switched during the read operation because during the read operation, the electric field for switching the polarization is not applied to the ferroelectric capacitor. Therefore, it is possible to prevent the fatigue of the ferroelectric film which occurs along with the read operation. In addition, it is also possible to prevent the reduction of the read speed due to the time required for the polarization switch. Further, the stored information is always held in the form of the nonvolatile information corresponding to the polarization state of the ferroelectric film as well as the volatile information stored at the storage node. Therefore, even if the power supply is turned off at any time, the information is not erased at all. In such a way, according to the present embodiment, it is possible to obtain the high reliable and high speed nonvolatile memory having the high degree of integration.

Figure 4:
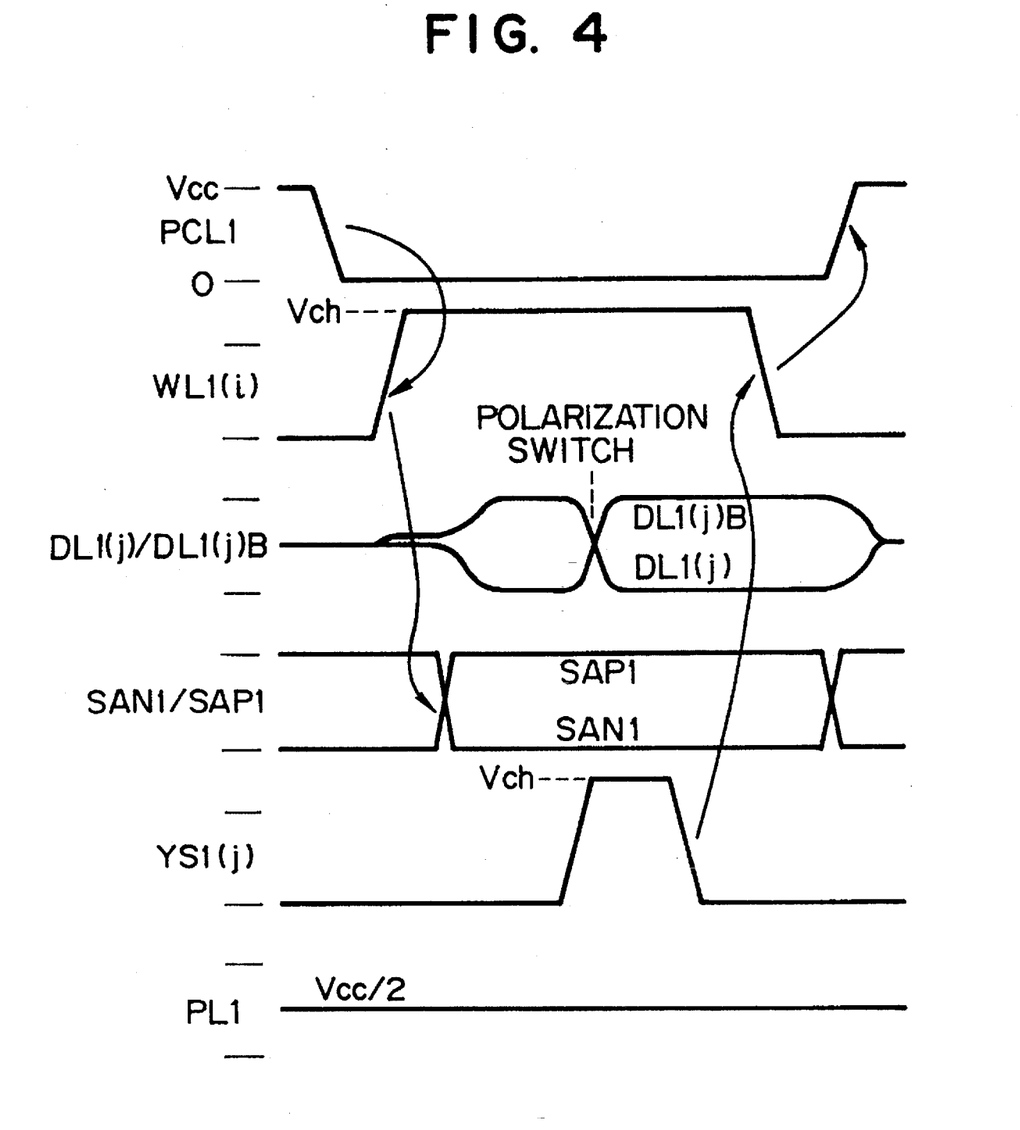
FIG. 4 is a timing chart showing the operation of rewriting the information in the memory cell array shown in FIG. 1.

FIG. 4 is a timing chart showing the operation of rewriting the information in the memory cell array shown in FIG. 1.

In the operation of rewriting the information in the present embodiment, the polarization switch of the ferroelectric film is performed together with the inversion of the electric potential at the storage node ST1. In the rewrite operation shown in FIG. 4, the operation until the electric potential on the signal line PCL1 is decreased from Vch down to 0 V to actuate the sense amplifier is the same as the read operation which was already described with reference to FIG. 3. Next, in order to write the information to be rewritten which has been prepared on the pair of IO lines to the desired memory cell, the electric potential on the signal line YS1(j) is increased from 0 V up to Vch. As a result, the electric potentials on the pair of data lines DL1(j) and DL1(j)B are inverted. Since the word line WL1(i) is in the activation state, the electric potential at the storage node and the polarization state of the ferroelectric film in the desired memory cell are inverted and switched along with the inversion of the electric potential on the pair of data lines. After the information has been rewritten in such a way, the rewrite operation is completed in the same procedure as that in FIG. 3. According to this embodiment of the present invention, the volatile information and the nonvolatile information are rewritten while always coinciding with each other. Therefore, there is provided the effect that the highly reliable nonvolatile memory can be obtained in which even if the power source is turned off at any time, the information is not erased at all. Incidentally, in order to readily invert the electric potential latched in the sense amplifier by the activation of the signal line YS1(j), the procedure may be adopted such that after the word line WL1(i) is temporarily deactivated to decrease the load on the pair of data lines, the electric potentials on the pair of data lines are inverted, and then that word line is again activated to invert the information stored in the associated memory cell.

Figure 5:
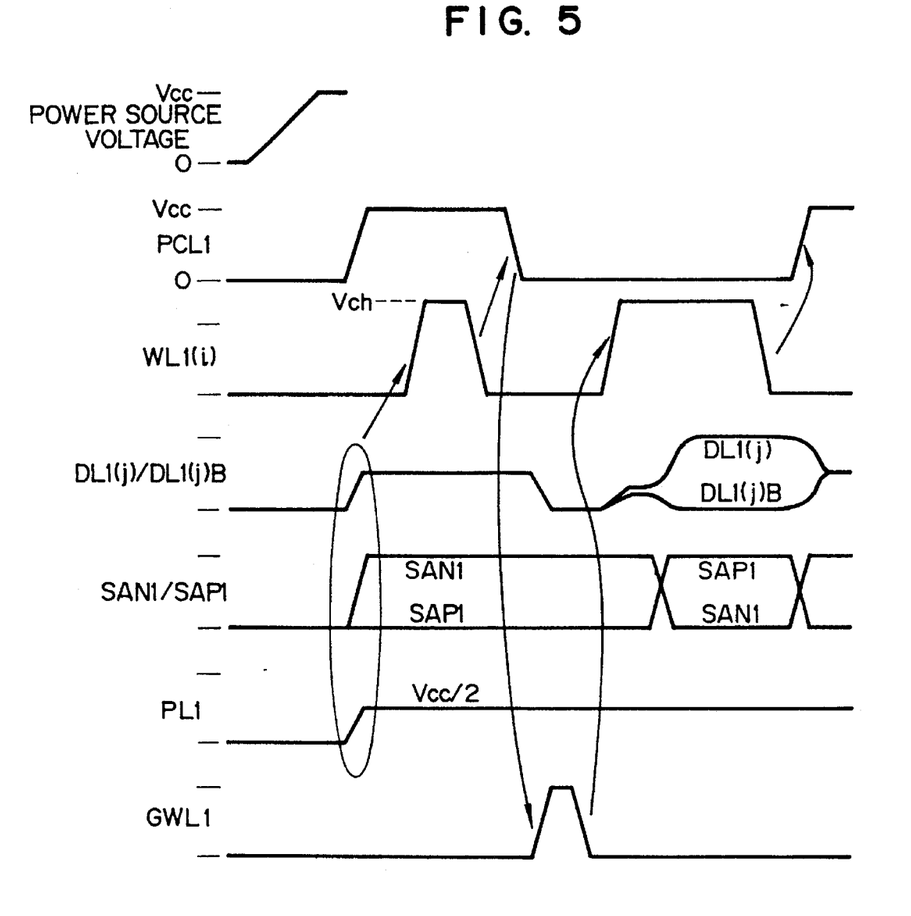
FIG. 5 is a timing chart showing the operation of converting the nonvolatile information into the volatile information in an on state of a power supply in the memory cell array shown in FIG. 1.

FIG. 5 is a timing chart showing the operation of converting the nonvolatile information into the volatile information, which is performed when the power supply is turned on, in the memory cell array shown in FIG. 1.

In the present embodiment, before turning the power supply on, all the electric potentials are 0 V. Along with the activation of the power supply, the electric potential at the plate PL1 is initialized to Vcc/2, and the electric potentials on the signal lines SAP1 and SAN1 of the sense amplifier are initialized to 0 V and Vcc, respectively. In addition, the electric potential on the signal line PCL is raised from 0 V up to Vcc, and as a result, the electric potentials on the pair of data lines DL1(j) and DL1(j)B are precharged to Vcc/2. During this time, the electrical potential on the word line is held at 0 V and the storage node ST1 is made in the floating state so that when boosting the electric potential at the plate, the polarization state of the ferroelectric film is not destroyed at all. At this time point, although the electric potential at the storage node ST1 is boosted from 0 V up to a level near about Vcc/2 through the ferroelectric capacitor, in order to further stabilize the polarization information, the following operation may be performed. That is, if the electric potential at the plate PL1 and the electric potentials on the pair of data lines DL1(j) and DL1(j)B are surely stabilized at Vcc/2, the word lines WL1(i) (i=1, 2, . . . , n) are activated one by one, and the electric potential at the storage node ST1 is surely made Vcc/2 which electric potential is the same as that at the plate PL1. From the above-mentioned initialization operation on, the operation proceeds to the operation of converting the nonvolatile information into the volatile information. First, the electric potential on the signal line PCL1 is made 0 V and also the associated pair of data lines are made in the floating state with all the word lines held at 0 V. Next, the signal line GWL1 is activated, and the pair of data lines are precharged to 0 V to be made in the floating state again. Thereafter, if the word lines WL1(i) are activated, the current is caused to flow from the storage node ST1 into the associated data line, and as a result, the electric potential on the associated data line is increased. The degree of increase of that electric potential depends on the polarization state of the ferroelectric film. That is, since after the electric potential on the associated data line has been increased, the plate is still maintained at a higher electric potential, the polarization state is arranged in one direction. The effective capacitance of the ferroelectric capacitor in the case where the above-mentioned activation of the word lines are accompanied by the switch of the polarization is larger than that in the case where the above-mentioned activation of the word lines are not accompanied by the switch of the polarization. As a result, the degree of increase of the electric potential on the associated data line becomes large. On the basis of the degree of increase of the electric potential on the associated data line, the initial polarization state of the ferroelectric film can be known. More specifically, the procedure may be adopted such that the dummy cell DM1 is provided which operates to generate an intermediate signal on the complementary data line DL1(j)B. The intermediate signal is between the electric potential generated on the associated data line corresponding to the two polarization states. The electric potential difference between the pair of data lines DL1(j) and DL1(j)B is detected and amplified by the sense amplifier SA1(j). The capacitor of the dummy cell is, for example, a paraelectric capacitor with a suitable capacitance which operates to generate the desired degree of the electric potential. The electric potential on the associated data line is charged to Vcc or 0 V by the operation of the sense amplifier, and as a result, the volatile information is written to the storage node ST1. Finally, after the word line has been deactivated, the electric potential on the associated data line is returned to Vcc/2 and a series of operations are completed. If the above-mentioned operations are performed with respect to the word lines WLi(i) (i=1, 2, . . . , n), the operation of converting the nonvolatile information into the volatile information will be completed.

As described above, according to the present embodiment, since the switch of the polarization of the ferroelectric film which occurs along with the operation of reading out the information can be limited to only the time when turning the power supply on, it is possible to prevent the fatigue of the ferroelectric film as much as possible. In addition, in the normal operating state, it is also possible to prevent the reduction of the read speed due to the time required for the polarization switch. Further, the information at the time point when turning the power supply off is stored, and therefore, when turning the power supply on the next time, that information can be recovered. Thus, according to the present embodiment, it is possible to obtain the highly reliable and high speed nonvolatile memory.

Figure 6:
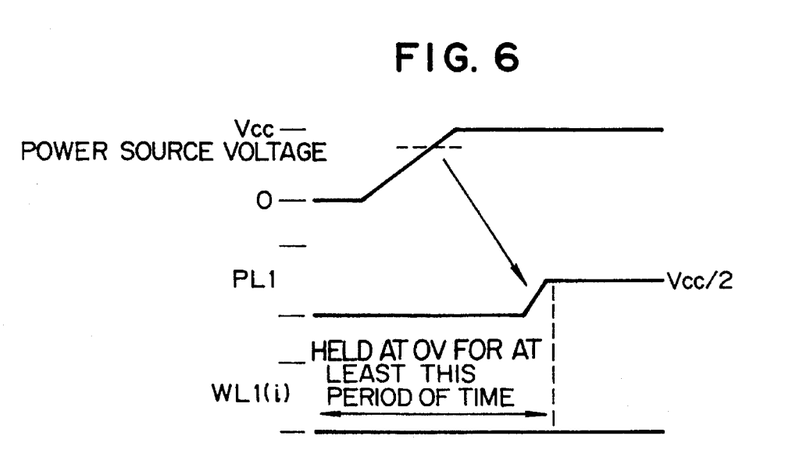
FIG. 6 is a timing chart showing the basically initial operation, which is to be performed in the on state of the power supply, in the ferroelectric memory array shown in FIG. 1.

FIG. 6 is a timing chart showing the basically initial operation, which is first to be performed when turning the power supply on, in the ferroelectric memory array shown in FIG. 1.

In the present embodiment, it is detected that by turning the power supply on, the power supply voltage is increased up to a level equal to or higher than the fixed level. If this fact is confirmed, the voltage of the plate PL1 is increased up to Vcc/2, and then the operation proceeds, for example, to the work of converting the nonvolatile information into the volatile information which has been described with reference to FIG. 5. On the other hand, for at least a period of time ranging from the time when turning the power supply on up to the time when the supply of the plate electric potential is completed, the electric potential on the word line is held at 0 V. Thus, according to the present embodiment, since when boosting the plate voltage, the storage node is necessarily in the floating state, the electric field across the ferroelectric capacitor remains so small that the polarization state is retained. As a result, the nonvolatile stored information which was held in the ferroelectric memory before turning the power supply on is not destroyed by the operation which is performed along with the actuation of the power supply. Thus, according to the present embodiment, it is possible to obtain the high reliable nonvolatile memory.

Figure 7:
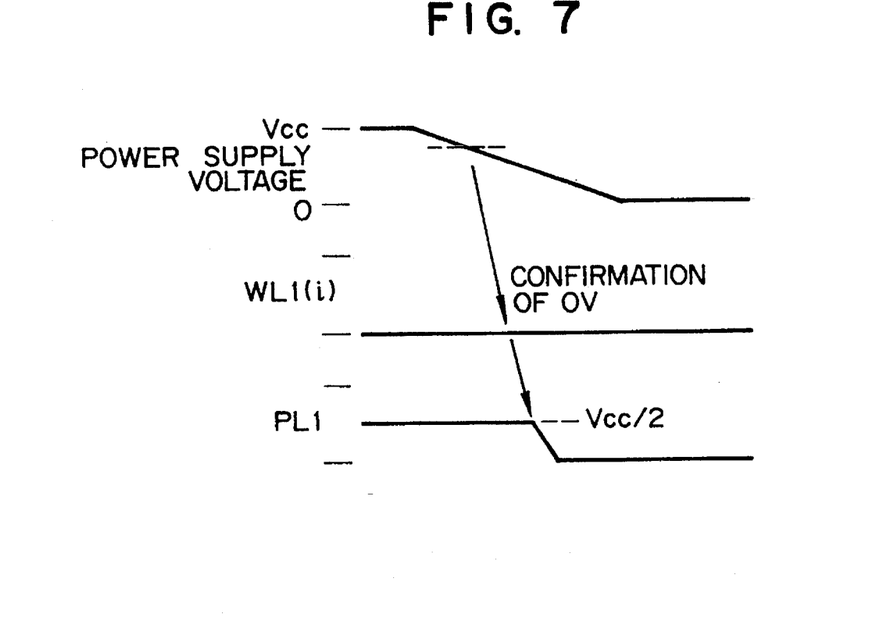
FIG. 7 is a timing chart showing the basic ending operation, which is to be performed in the off state of the power supply, in the ferroelectric memory array shown in FIG. 1.

FIG. 7 is a timing chart showing the basic ending operation, which is to be performed in the off state of the power supply, in the ferroelectric memory array shown in FIG. 1.

In the present embodiment, when the power supply is forced to be turned off intentionally or due to unexpected trouble, a circuit for detecting a power supply voltage is actuated which operates to detect that the power supply voltage is reduced down to a level equal to or lower than the fixed level, and then the ending operation is started. First, the electric potentials on all the word lines WL1(i) are made 0 V. Next, the voltage of the plate PL1 is discharged speedily from Vcc/2 down to 0 V.

According to the present embodiment, since when the electric potential at the storage node is Vcc for example, the plate electric potential can be made 0 V before the electric potential at the storage node is slowly discharged down to 0 V by the junction leakage current and the like, the electric field for switching the polarization is not applied to the ferroelectric capacitor. Therefore, even if the power supply is forced to be turned off intentionally or due to unexpected trouble, the nonvolatile stored information is not destroyed at all. Thus, according to the present embodiment, the highly reliable nonvolatile memory can be obtained on the basis of the simple ending operation. Incidentally, it is, of course, to be understood that there is obtained the effect that even against the noise of a certain sort by which the power supply voltage is dropped for the fixed period of time and then is recovered again, the operation shown in FIG. 7 functions effectively, and thus the highly reliable ferroelectric memory can be obtained.

Figure 8:
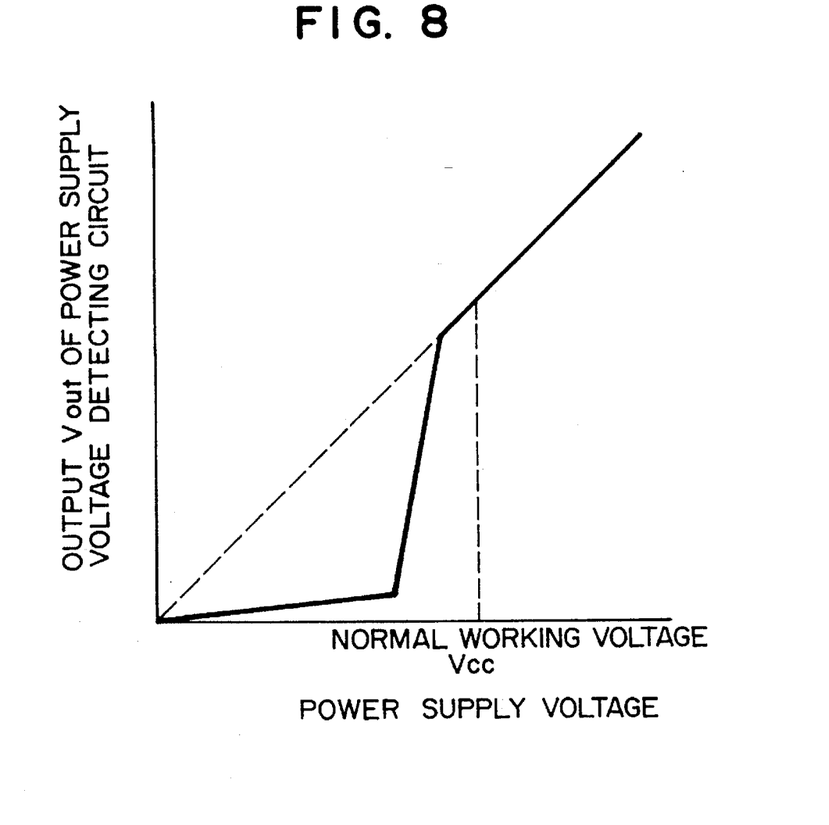
FIG. 8 is a graphical representation showing the output characteristic of a circuit for detecting a power supply voltage in the first embodiment of the present invention.
Figure 9:
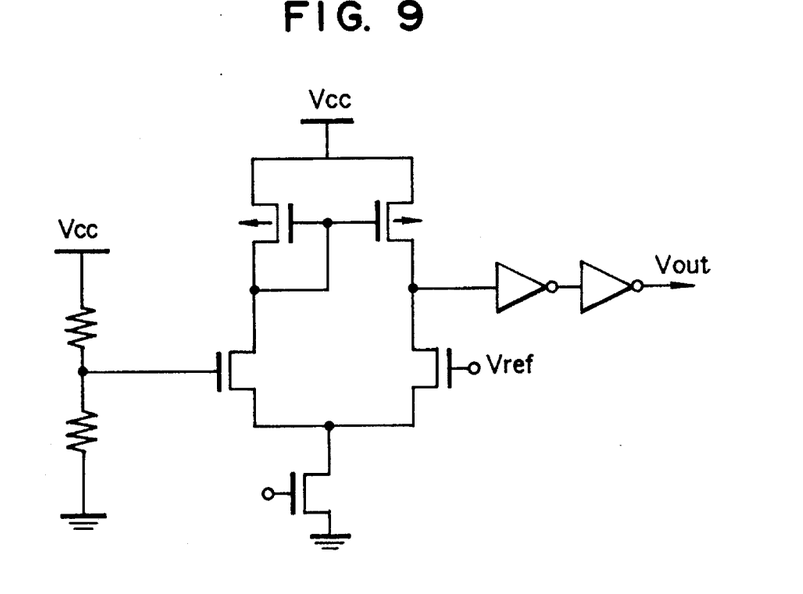
FIG. 9 is a circuit diagram showing a configuration of the power supply voltage detecting circuit in the first embodiment of the present invention.

As for the circuit for detecting the power supply voltage employed in the operations of FIGS. 6 and 7, for example, the circuit having the characteristic shown in FIG. 8 may be employed. In this dynamic characteristic, with the fixed voltage lower than the normal operating voltage Vcc as the boundary, the output Vout of the circuit for detecting the power supply voltage is about 0 V in the region equal to or lower than that fixed voltage, and the output Vout thereof is equal to the power supply voltage in the region equal to or higher than that fixed voltage. In this connection, the concrete circuit may be configured by utilizing the differential amplifier as shown in FIG. 9.

Figure 10:
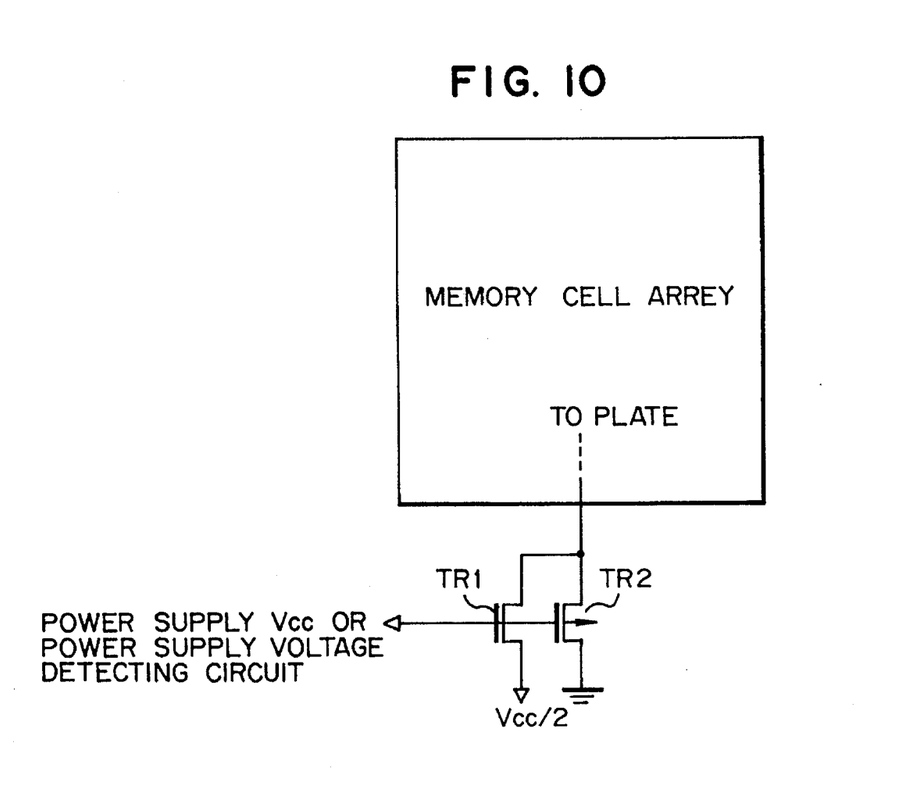
FIG. 10 is a circuit diagram showing a configuration of a circuit for supplying a plate electric potential in the first embodiment of the present invention.

FIG. 10 is a circuit diagram showing a configuration of a circuit for supplying a plate electric potential in the ferroelectric memory array shown in FIG. 1.

The plate of the present embodiment is connected to the level of Vcc/2 through an n-channel field effect transistor TR1 and also is connected to the ground level 0 V through a p-channel field effect transistor TR2. The common gate of those MOS transistors is connected to either the terminal at the same potential level as that of the power supply or the output terminal of the power supply voltage detecting circuit. During the normal operating state, the gate voltage of the p-channel MOS transistor is Vcc and the plate is electrically separated from the ground level. As soon as the power supply is turned off, the gate voltage of the n-channel MOS transistor becomes 0 V, the plate is electrically separated from the level of Vcc/2, and also the gate voltage of the p-channel MOS transistor becomes 0 V, whereby the p-channel MOS transistor is turned on and the plate electric potential is speedily dropped down to 0 V. Now, the parasitic capacity which is loaded on the above-mentioned gate is made small as much as possible so that as soon as the power supply is turned off, the plate electric potential can be speedily dropped down to 0 V.

As described above, according to the present embodiment, as soon as the power supply is turned off, the plate voltage can be speedily dropped down to 0 V with the simple circuit configuration. Therefore, it is possible to obtain the highly reliable ferroelectric memory in which even when the power supply is forced to be turned off due to the unexpected trouble, the polarization of the ferroelectric film is definitely not switched, and thus the information is not destroyed at all.
(Second Embodiment)

Figure 11:
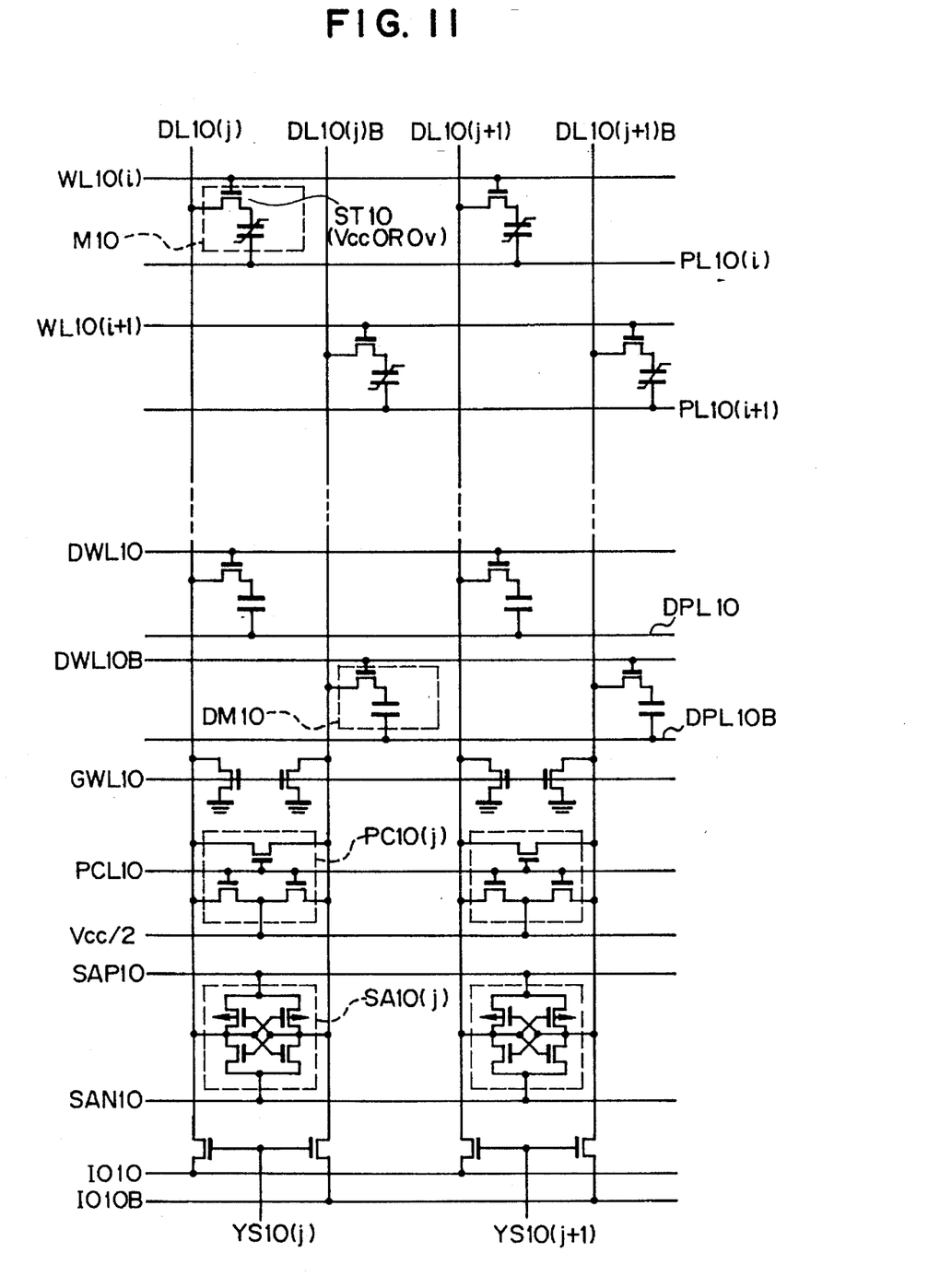
FIG. 11 is a circuit diagram showing an array configuration of a ferroelectric memory in a second embodiment of the present invention.

FIG. 11 is a circuit diagram showing an array configuration of a ferroelectric memory in a second embodiment of the present invention.

In the first embodiment (refer to FIG. 1), the plate is common to all the memory cells, whereas in the present embodiment shown in FIG. 11, the plate is common to only the memory cells which are connected to the common word line, and thus a plurality of plate lines PL10(i), PL10(i+1) are necessarily provided. In the present embodiment, in the normal operating state, the ferroelectric memory is used as the volatile memory in the same way as that in FIGS. 3 and 4. On the other hand, when converting the nonvolatile information into the volatile information in the on state of the power supply, on the basis of the operation method as will hereinbelow be described, for the memory cells connected to the activated word line, only the electric potential on the associated plate line is selectively boosted to read out the nonvolatile information.

Figure 12:
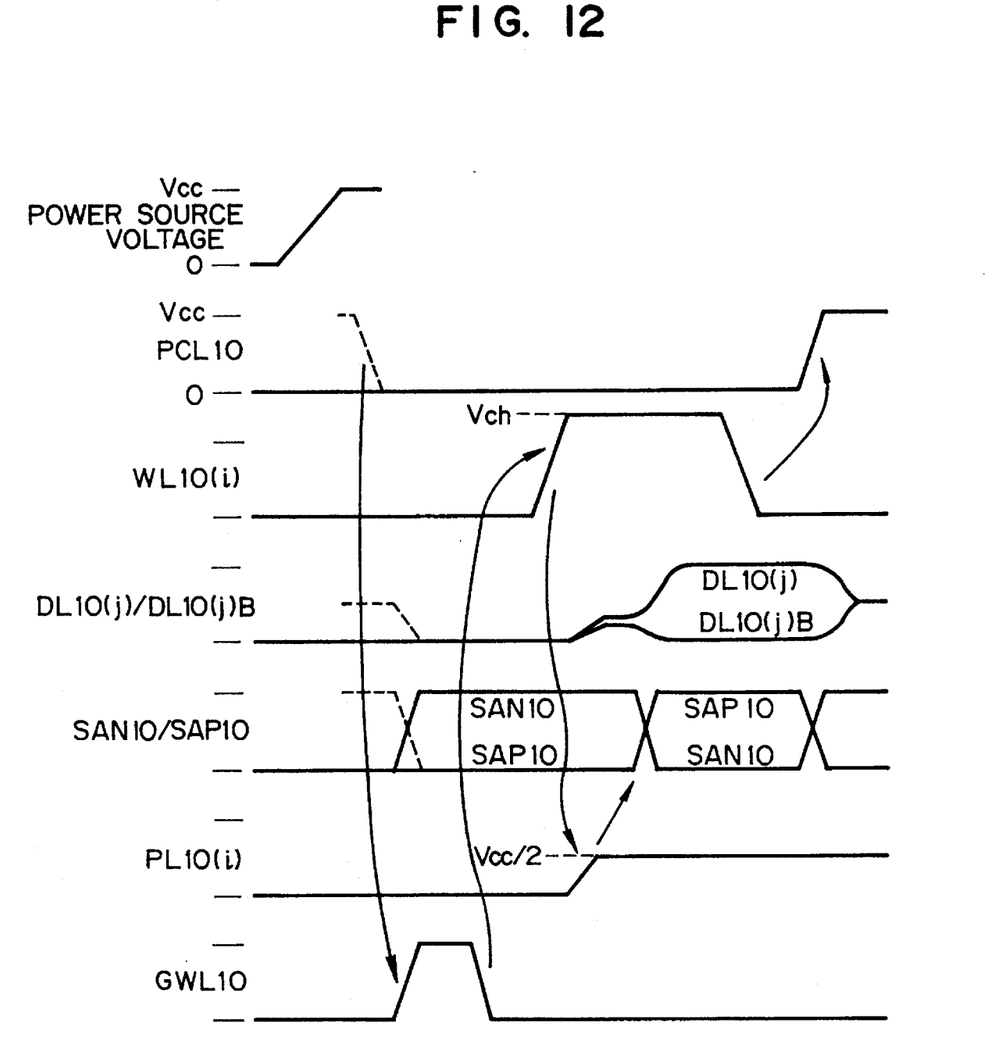
FIG. 12 is a timing chart showing the operation of converting the nonvolatile information into the volatile information in the on state of the power supply in the memory cell array shown in FIG. 11.

FIG. 12 is a timing chart showing the operation of converting the nonvolatile information into the volatile information, which is performed when the power supply is turned on, in the memory cell array shown in FIG. 11.

In the present embodiment, just after the power supply has been turned on, all the nodes are at the ground level 0 V. First, the electric potential on a signal line SAN10 is made Vcc to deactivate the sense amplifier and also the electric potential on a grounding word line GWL10 is made Vcc to make certain the electric potential on the pair of data lines 0 V. After the electric potential on the grounding word line GWL10 is returned to 0 V to make the pair of data lines in the floating state, a word line WL10(i) is activated. Next, if the plate line of the group of memory cells connected to that word line is boosted up to Vcc/2, the associated data line is boosted through the ferroelectric capacitor. Since the degree of boost of the electric potential varies depending on the polarization state of the ferroelectric capacitor, if that degree of boost of the electric potential is detected, the nonvolatile information can be read out. In this connection, the same dummy cell as that described with reference to FIG. 5 is provided on the complementary data line DL10(j)B side so that the voltage to be the reference is generated. The signal relating to the small voltage difference between the pair of data lines is amplified by activating the sense amplifier through the signal lines SAN10 and SAP10. Finally, if the word line is deactivated and the sense amplifier is also deactivated, the operation of converting the nonvolatile information into the volatile information will be completed. If the above-mentioned conversion operation is performed with respect to all the word lines WL10(i) (i=1, 2, . . . , n), all the nonvolatile information can be converted into the volatile information. But, after the power supply has been turned on, in the second and subsequent activation of the word lines, as shown by dotted lines in FIG. 12, the electric potential on the signal line SAP10 needs to be decreased from Vcc down to 0 V. In addition, in FIG. 12, whenever the conversion operation has been completed with respect to one word line, the signal line PCL10 is activated and also the associated pair of data lines are precharged up to Vcc/2. Along with this operation, in the second and subsequent activation of the word lines, as shown by the dotted lines in FIG. 12, it is required that first, the signal line PCL10 is deactivated, and then the signal line GWL10 is activated to decrease the electric potentials on the associated pair of data lines from Vcc/2 down to 0 V. However, when the conversion operation has been completed with respect to one word line, the signal line PCL10 is not necessarily activated.

As described above, according to the present embodiment, when boosting the plate line, the polarization states of the ferroelectric capacitors connected to that plate line are always detected. Therefore, there is provided the effect that the operation of converting the nonvolatile information into the volatile information is stably performed. That is, while the nonvolatile information in a certain ferroelectric capacitor is read out, there is absolutely no possibility that the information in the non-selected ferroelectric capacitors may be destroyed.

(Third Embodiment)

Figure 13:
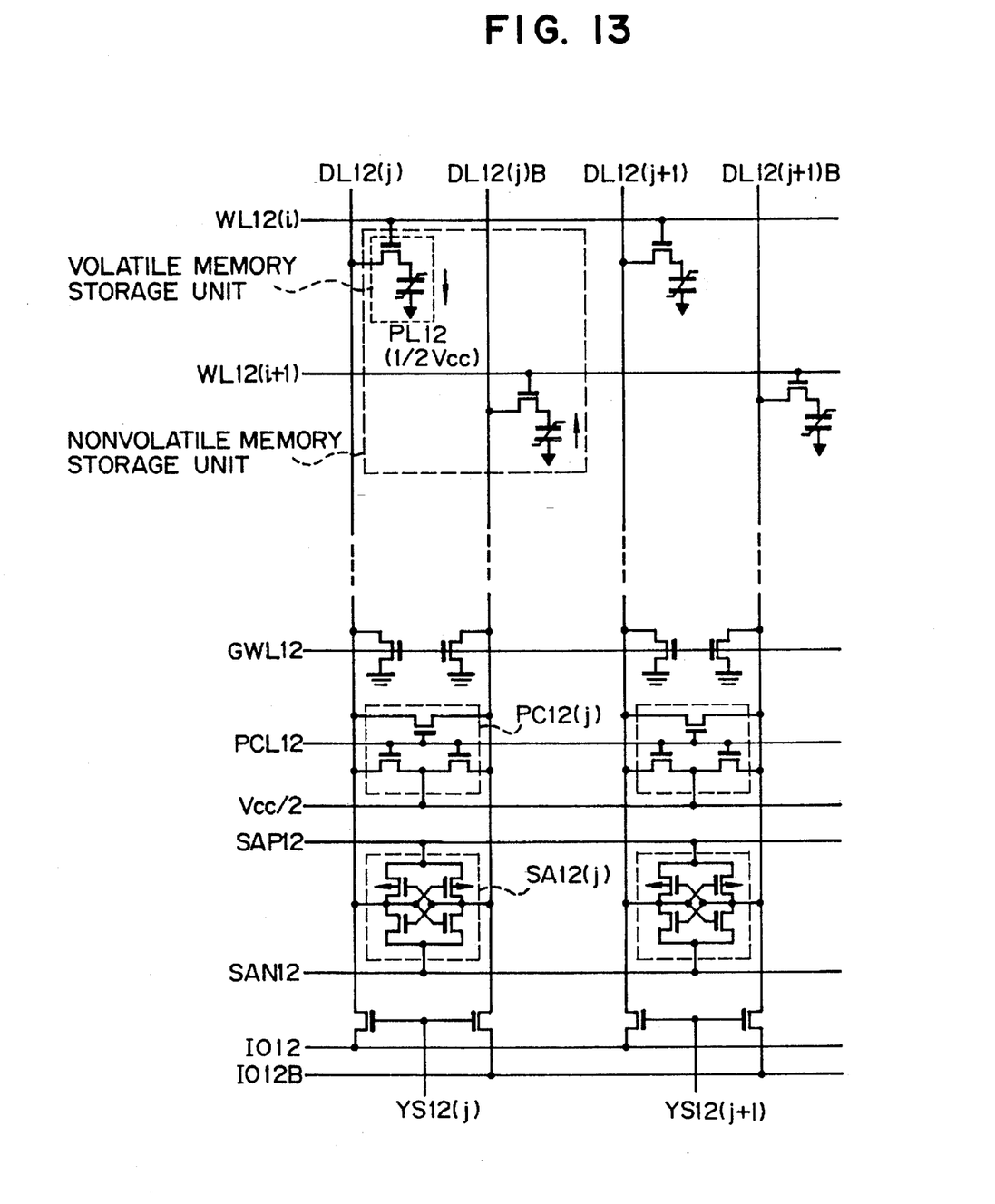
FIG. 13 is a circuit diagram showing an array configuration of a ferroelectric memory in a third embodiment of the present invention.

FIG. 13 is a circuit diagram showing an array configuration of a ferroelectric memory in a third embodiment of the present invention.

In the case where the volatile information is to be stored in the ferroelectric memory of the present embodiment, one memory cell is used as a unit of storage. On the other hand, in the case where the nonvolatile information is to be stored in the ferroelectric memory of the present embodiment, two memory cells are used as a unit of storage. Then, the polarization of one state is recorded in the ferroelectric capacitor of one memory cell and the polarization of the opposite state is recorded in the ferroelectric capacitor of the other memory cell. The operation of reading out the nonvolatile information is performed in the same way as that in the operation method of FIG. 5. But, no dummy cell is employed, and also the word lines WL12(i) and WL12(i+1) which are connected to the two memory cells, respectively, are simultaneously activated. The nonvolatile information which has been read out is complimentarily converted to be stored as the volatile information in the two memory cells. That is, the nonvolatile information is complimentarily converted into the storage voltages corresponding to the polarization states opposite to each other of the respective ferroelectric capacitors. In the normal operation in which the ferroelectric memory acts as the volatile memory, since only the information which is stored in one of the two memory cells is sufficient, the other memory cell can be used to store the information to be stored which is necessary for only the temporary calculation and does not need to be left in the form of the nonvolatile information. As described above, according to the present embodiment, no dummy cell is required when reading out the nonvolatile information, and the operation by the nonvolatile memory can be further stably performed.

(Fourth Embodiment)

Figure 14:
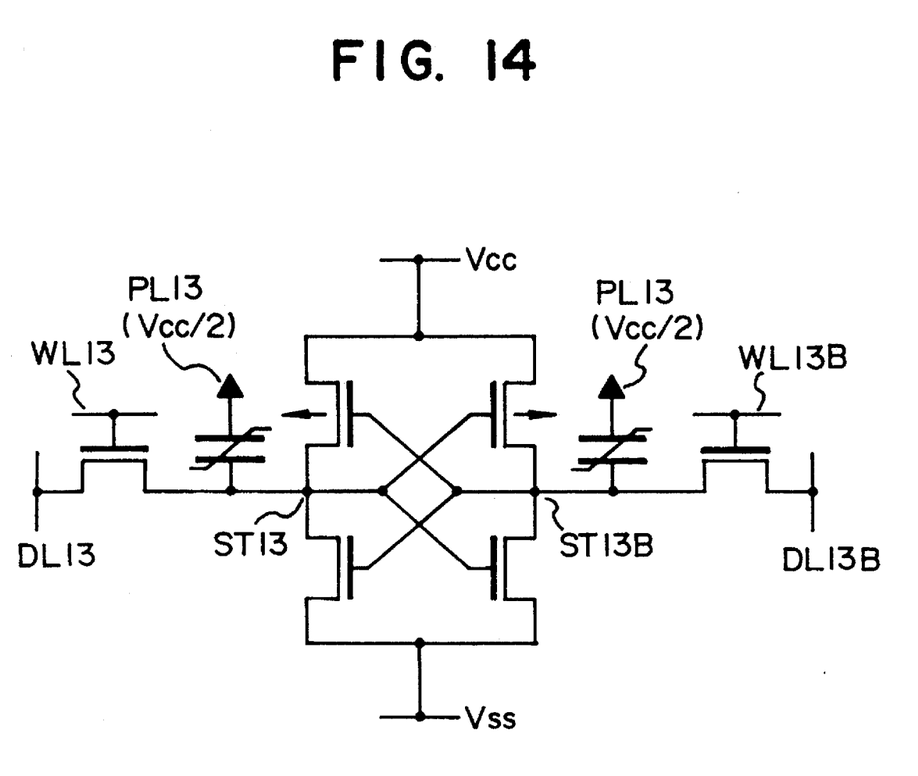
FIG. 14 is a circuit diagram showing a configuration of a ferroelectric memory cell in a fourth embodiment of the present invention.

FIG. 14 is a circuit diagram showing a configuration of a ferroelectric memory cell in a fourth embodiment of the present invention. In the present embodiment, the ferroelectric memory cell has a configuration similar to that of the static random access memories (SRAMs).

In the present embodiment, to the complementary storage nodes ST13 and ST13B which are constituted by a flip-flop circuit, the ferroelectric capacitors are respectively connected. The plate voltage of each ferroelectric capacitor is Vcc/2 which is about half the power supply voltage.

According to the present embodiment, when reading out the volatile information in the form of the voltages of the storage nodes ST13 and ST13B, the polarization of each ferroelectric capacitor is not switched. When rewriting the volatile information, the polarization state is also simultaneously switched. Therefore, the volatile information always coincides with the nonvolatile information in the form of the polarization state of each ferroelectric capacitor. Therefore, there is provided the effect that even if the power source is turned off at any time, the information can be left in the ferroelectric memory cell. In addition, since the polarization switch is limited to only the time when rewriting the information, i.e., is kept to a minimum, it is possible to suppress the fatigue of the ferroelectric film and thus it is possible to obtain the high reliable ferroelectric memory.

As set forth hereinabove, according to the present invention, the high reliable and high speed ferroelectric memory having the high degree of integration is provided.

What is claimed is:

1. A ferroelectric memory comprising:

a plurality of memory cells each of which has a capacitor using a ferroelectric material as the dielectric between the electrodes and a field effect transistor;

a plurality of data lines each of which is coupled to a source or a drain of the corresponding field effect transistor of each memory cell of said plurality of memory cells;

a plurality of word lines each of which is coupled to a gate of the corresponding field effect transistor of each memory cell of said plurality of memory cells;

means for supplying stored voltages each showing information which operates to apply a first operating voltage or a second operating voltage to a storage electrode of the capacitor of each memory cell of said plurality of memory cells through a source-drain path of the corresponding field effect transistor;

means for supplying an intermediate voltage which operates to apply a third operating voltage, which level is between said first and second operating voltages, to a plate electrode of the capacitor of each memory cell of said plurality of memory cells;

a first precharge circuit for precharging, in response to a signal for specifying the read operation of a first mode, the desired data line of said plurality of data lines to a fourth operating voltage, which level is between said first and second operating voltages; and a second precharge circuit for precharging, in response to a signal for specifying the read operation of a second mode, the desired data line of said plurality of data lines to a fifth operating voltage different from said fourth operating voltage.

2. A ferroelectric memory according to claim 1, further comprising means for setting said third and fourth operating voltages of said ferroelectric memory to about the same electric potential.

3. A ferroelectric memory according to claim 1, further comprising:

first detection means for detecting that the second operating voltage supplied to said ferroelectric memory is dropped down to a level equal to or lower than a fixed value; and control means for performing the control in such a way that when an output of said first detection means shows a first state, said first operating voltage is applied to said plurality of word lines and then said first operating voltage is applied to the plate of the capacitor of each memory cell of said plurality of memory cells.

4. A ferroelectric memory according to claim 1, further comprising:

first detection means for detecting that the second operating voltage supplied to said ferroelectric memory reaches a level equal to or higher than a fixed value; and control means for performing the control in such a way that when an output of said first detection means shows a first state, said third operating voltage is applied to the plate electrode of the capacitor of each memory cell of said plurality of memory cells by said intermediate voltage applying means, and said first operating voltage is continued to be applied to said plurality of word lines until said third operating voltage is applied to the plate electrode.

5. A ferroelectric memory according to claim 1, further comprising:

first detection means for detecting that the second operating voltage supplied to said ferroelectric memory reaches a level equal to or higher than a fixed value; and precharge means for precharging, when the stored information in the desired memory cell of said plurality of memory cells is read out, in the case where the operation of reading out the stored information in said desired memory cell is a first read operation after an output of said first detection means shows a first state, the desired data line connected to said desired memory cell to said fifth operating potential.

6. A ferroelectric memory according to claim 1, further comprising:

first detection means for detecting that the second operating voltage supplied to said ferroelectric memory is dropped down to a level equal to or lower than a fixed value;

second detection means for detecting that the second operating voltage supplied to said ferroelectric memory reaches a level equal to or higher than a fixed value; and control means for performing the control in such a way that when an output of said first detection means shows a first state, said first operating voltage is applied to said plurality of word lines and then said first operating voltage is applied to the plate of the capacitor of each memory cell of said plurality of memory cells, and when an output of said second detection means shows a second state, said third operating voltage is applied to the plate electrode of the capacitor of each memory cell of said plurality of memory cells by said intermediate voltage applying means, and said first operating voltage is continued to be applied to said plurality of word lines until said third operating voltage is applied to the plate electrode.

7. A ferroelectric memory according to claim 1, further comprising:

a plurality of plate lines each of which is coupled to the corresponding group of memory cells of said plurality of memory cells, wherein said group of memory cells couple to the corresponding word line of said plurality of word lines.

8. A ferroelectric memory according to claim 1, wherein said first mode is the mode that the ferroelectric memory is treated as a non-volatile memory, and wherein said second mode is the mode that the ferroelectric memory is treated as a volatile memory.

9. A ferroelectric memory comprising:

a plurality of memory cells each of which has a flip-flop circuit including two capacitors each of which uses a ferroelectric material as the dielectric between the electrodes and each of whose storage electrode is coupled to the corresponding storage node of the flip-flop circuit;

a plurality of data lines each of which is coupled to the corresponding memory cell of said plurality of memory cells;

a plurality of word lines each of which is coupled to the corresponding memory cell of said plurality of memory cells;

means for supplying stored voltages each showing information which operates to apply a first operating voltage or a second operating voltage to the storage electrode of the capacitance of each memory cell of said plurality of memory cells; and means for supplying an intermediate voltage which operates to apply a third operating voltage, which level is between said first and second operating voltages, to the plate electrode of the capacitor of each memory cell of said plurality of memory cells.

* * * * *